(12) United States Patent
Okada et al.

(10) Patent No.: US 7,315,027 B2
(45) Date of Patent: Jan. 1, 2008

(54) RADIATION DETECTION DEVICE, SCINTILLATOR PANEL, METHOD OF MAKING THE SAME, MAKING APPARATUS, AND RADIATION IMAGE PICK-UP SYSTEM

(75) Inventors: Satoshi Okada, Zama (JP); Tomoyuki Tamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 161 days.

(21) Appl. No.: 10/557,006

(22) PCT Filed: Oct. 19, 2004

(86) PCT No.: PCT/JP2004/015770

§ 371 (c)(1),
(2), (4) Date: Nov. 16, 2005

(87) PCT Pub. No.: WO2005/038490

PCT Pub. Date: Apr. 28, 2005

(65) Prior Publication Data

US 2007/0051896 A1   Mar. 8, 2007

(30) Foreign Application Priority Data

Oct. 22, 2003   (JP) .............................. 2003-362084
Oct. 22, 2003   (JP) .............................. 2003-362085

(51) Int. Cl.
   *G01T 1/20*   (2006.01)
(52) U.S. Cl. ................................. 250/370.11
(58) Field of Classification Search ........... 250/370.11, 250/581, 367, 361 R, 483.1
   See application file for complete search history.

(56) References Cited

U.S. PATENT DOCUMENTS 4,037,105 A  *  7/1977  Laurer ........................ 250/367
4,437,011 A     3/1984  Noji et al. ............... 250/486.1

(Continued)

FOREIGN PATENT DOCUMENTS

CN   1217906   6/1999

(Continued)

OTHER PUBLICATIONS

Office action dated Jun. 22, 2007 for corresponding Chinese Application No. 2004800174417.

*Primary Examiner*—David Porta
*Assistant Examiner*—David S Baker
(74) *Attorney, Agent, or Firm*—Fitzpatrick, Cella, Harper & Scinto

(57) ABSTRACT

There are provided a scintillator (130) comprising a structure in which a plurality of scintillator layers (131, 132, 135) having columnar crystal structures are stacked with, and a radiation detection device using the scintillator. There are also provided a scintillator (130) comprising a structure in which a plurality of scintillator layers (131, 132, 135) and light-transmitting intermediate layers (138, 139) disposed among the plurality of scintillator layers (131, 132, 135) are alternately stacked with, and a radiation detection device using the scintillator. Accordingly, it is possible to control the scintillator layer in such a manner as to reduce irregularities on the surface of the scintillator layer, and reduce an abnormal growth portion such as a splash existing inside the scintillator layer. Therefore, a radiation detection device can be obtained which has high reliability, high resolution, and small correction error of a digital image.

7 Claims, 9 Drawing Sheets

U.S. PATENT DOCUMENTS

| | | | |
|---|---|---|---|
| 4,528,210 A | 7/1985 | Noji et al. | 427/70 |
| 5,753,917 A * | 5/1998 | Engdahl | 250/367 |
| 6,087,663 A * | 7/2000 | Moisan et al. | 250/367 |
| 6,087,665 A | 7/2000 | Hoffman et al. | |
| 6,278,118 B1 | 8/2001 | Homme et al. | 250/370.11 |
| 6,362,479 B1 * | 3/2002 | Andreaco et al. | 250/366 |
| 6,448,559 B1 * | 9/2002 | Saoudi et al. | 250/367 |
| 6,469,307 B2 | 10/2002 | Takabayashi et al. | 250/370.11 |
| 6,531,225 B1 | 3/2003 | Homme et al. | 428/408 |
| 6,573,506 B2 | 6/2003 | Sato et al. | 250/361 R |
| 6,849,336 B2 | 2/2005 | Homme et al. | 428/408 |
| 6,940,072 B2 | 9/2005 | Homme et al. | 250/370.11 |
| 7,019,301 B2 | 3/2006 | Homme et al. | 250/370.11 |
| 7,034,306 B2 | 4/2006 | Homme et al. | 250/368 |
| 7,112,801 B2 | 9/2006 | Homme et al. | 250/370.11 |
| 7,132,665 B2 | 11/2006 | Sato et al. | 250/368 |
| 2001/0045522 A1 | 11/2001 | Homme et al. | 250/361 R |
| 2002/0017613 A1 | 2/2002 | Homme et al. | 250/370.11 |
| 2002/0074502 A1 | 6/2002 | Takabayashi et al. | 250/368 |
| 2002/0158205 A1 | 10/2002 | Sato et al. | 250/361 R |
| 2002/0192471 A1 | 12/2002 | Homme et al. | 428/408 |
| 2003/0001101 A1 | 1/2003 | Homme et al. | 250/370.11 |
| 2003/0205674 A1 | 11/2003 | Sato et al. | 250/368 |
| 2004/0135092 A1 | 7/2004 | Homme et al. | 250/370.11 |
| 2005/0077473 A1 | 4/2005 | Homme et al. | 250/370.11 |
| 2005/0087693 A1 * | 4/2005 | Sumiya et al. | 250/367 |
| 2006/0033031 A1 | 2/2006 | Takeda et al. | 250/370.11 |
| 2006/0033032 A1 | 2/2006 | Inoue et al. | 250/370.11 |
| 2006/0033040 A1 | 2/2006 | Okada et al. | 250/484.2 |
| 2006/0038131 A9 | 2/2006 | Homme et al. | 250/370.11 |
| 2006/0261286 A1 | 11/2006 | Homme et al. | 250/483.1 |
| 2007/0040125 A1 * | 2/2007 | Sato et al. | 250/367 |
| 2007/0069141 A1 * | 3/2007 | Nittoh et al. | 250/367 |

FOREIGN PATENT DOCUMENTS

| | | |
|---|---|---|
| CN | 1217906 A | 6/1999 |
| CN | 1222977 | 7/1999 |
| CN | 1222977 A | 7/1999 |
| DE | 198 53 648 A1 | 5/1999 |
| DE | 19853648 A1 | 5/1999 |
| EP | 0 042 149 A1 | 12/1981 |
| EP | 0 932 053 A1 | 7/1999 |
| EP | 0 997 949 A2 | 5/2000 |
| JP | 57-7051 A | 1/1982 |
| JP | 57-136744 A | 8/1982 |
| JP | 3029873 | 2/2000 |
| JP | 2000-131444 A | 5/2000 |
| JP | 3126715 | 11/2000 |
| JP | 2002-243859 | 8/2002 |
| JP | 2003-66196 | 3/2003 |

* cited by examiner

RADIATION DETECTION DEVICE, SCINTILLATOR PANEL, METHOD OF MAKING THE SAME, MAKING APPARATUS, AND RADIATION IMAGE PICK-UP SYSTEM

TECHNICAL FIELD

The present invention relates to a radiation detection device for use in medical or analytical radiation image pick-up, a method of making the device, and a radiation detection system. It is to be noted that in the present description, electromagnetic waves such as X-rays and g-rays are assumed to be included in radiations.

Radiation detection devices each constituted of a radiation sensitive sheet having a scintillator layer for converting X-rays into light, and a radiation film having a photosensitive layer have heretofore been used generally in X-ray photography.

However, in recent years, radiation detection devices have been developed each having a two-dimensional detector comprising a scintillator constituted of a scintillator layer, a photoelectric conversion element using amorphous silicon (a-Si), and a thin-film transistor for a switch. This radiation detection device has been proposed as a flat panel detector (FPD), and is a photographing device having a large area and capable of being digitized. Since obtained data is digital data, image processing is facilitated. When the data is taken into a networked computer system, the data can be shared. When digital image data is stored in an optical magnetic disk or the like, a storage space can be remarkably decreased as compared with a case where the film is stored, and there is an advantage that previous images can be easily retrieved. In this case, for medical uses, a digital radiation detection device having characteristics such as high sensitivity and high clearness has been required in order to reduce patients' dosage of exposure to radiation.

For example, in Japanese Patent 3126715, a digital radiation detection device has been disclosed in which a scintillator constituted of the scintillator layer formed by depositing columnar crystals of Tl-doped CsI on a substrate by a vapor deposition process is bonded to a photodetector to thereby improve sensitivity and reliability.

Moreover, in Japanese Patent 3029873, a radiation detection device has been described in which a columnar crystals of CsI are deposited on light-receiving elements of a light-receiving element array having a light-receiving unit constituted of a plurality of light-receiving elements by a vapor deposition process to form a scintillator layer, and the surface and side faces of the scintillator layer and a region around a formed region of the scintillator layer in the light-receiving element array are coated with organic films. In the scintillator layer formed of CsI having this columnar structure, light is hardly scattered, and resolution can be enhanced.

BACKGROUND ART

FIG. 11 shows a cross-sectional view of a radiation detection device described in the Japanese Patent 312675. In FIG. 12, reference numeral 110 denotes a scintillator panel (referred to also as the "fluorescent plate") comprising: a scintillator layer 113 constituted of a scintillator material crystallized into a columnar shape; a substrate 111 for supporting the scintillator layer 113; a reflective layer 112 constituted of an aluminum thin film which reflects light converted by the scintillator layer 113 on the side of a sensor panel (referred to also as the "photoelectric conversion panel") described later; a protective layer 115 for protecting the layer; and a protective layer 114 formed of an organic resin to protect the scintillator layer 113 and the like from outside air.

Moreover, in FIG. 11, reference numeral 100 denotes a photoelectric conversion panel comprising: a glass substrate 101; a photoelectric conversion element portion 102 constituted of a photo sensor and TFT using amorphous silicon; and a protective layer 104 which protects the photoelectric conversion element portion 102 and which is formed of silicon nitride and the like.

Furthermore, the photoelectric conversion panel 100 is bonded to the scintillator panel 110 by an adhesive layer 120 formed of a transparent adhesive, and the periphery is sealed by a sealing material 140. Here, a thickness of each layer which transmits the light needs to be correctly controlled in order to prevent resolution from being scattered. Especially, the adhesive layer 120 needs to be prevented from being excessively thick. The adhesive layer 120 is applied between the sensor panel 100 and the scintillator panel 110, thereafter they are entirely drawn with a roller, and the layer is bonded to the panel in such a manner that the adhesive layer 120 is prevented from being thickened.

X-rays which have fallen from an upper part in FIG. 11 pass through the substrate 111, reflective layer 112, and protective layer 115, and is absorbed by the scintillator layer 113, and thereafter the scintillator layer 113 emits visible light. Since the visible light travels through the scintillator layer 113 on the sensor panel 100 side, the light enters the photoelectric conversion element portion 102 through the protective layer 114, adhesive layer 120, and protective layer 104 without diffusing.

In the photoelectric conversion element portion 102, the incident visible light is converted into an electric signal, and read to the outside through a wiring portion 103 by switching. In this manner, incident X-ray information is converted into a two-dimensional digital image by the X-ray detection device shown in FIG. 12.

Here, alkali halide scintillator materials having columnar crystal structures have been used as materials of the scintillator layer 113 for a high-sensitivity X-ray detection device. Among the materials, especially cesium iodide (CsI):Tl is used whose emission wavelength matches a sensitivity wavelength of the photoelectric conversion element. A maximum emission wavelength of CsI:Tl is 500 nm to 600 nm. As a method of forming the alkali halide scintillator material into a film, a vapor deposition process is used. For example, CsI:Tl is obtained by codeposition of cesium iodide (CsI) and thallium iodide (TlI) on the substrate 111. It is known that the thickness of the scintillator layer 113 having the columnar crystal structure is, for example, 200 μm to 450 μm. In the alkali halide scintillator material obtained by the vapor deposition, the scintillator layer needs to be heated at a temperature of 200 to 250° C. in order to raise light emission after a vapor deposition step.

When the scintillator layer 113 is crystallized into the columnar shape, projective portions 116 having a height of several tens to hundreds of micrometers from the surface are formed by partially generated abnormal growth by dust, splash at a vapor deposition time, fluctuations of surface roughness of the substrate 111 and the like. This projective portion 116 forms a concave/convex portion constituted of a convex portion and a peripheral concave portion, and causes problems: 1) destruction of the element; 2) destruction of the protective film; 3) mixing of bubbles; 4) drop of resolution and the like. As countermeasures, it has been described that Japanese Patent Application Laid-Open Nos. 2003-66196 and 2002-243859 that the scintillator material is formed, and thereafter irregularities on the surface are reduced to solve the above-described problems. As a result, the irregularities of the projective portions 116 shown in FIG. 12 are reduced, and projective portions 117 in which the irregularities have been corrected are formed as shown in FIG. 12.

DISCLOSURE OF THE INVENTION

However, in a method of removing irregularities generated by abnormal growth of the splash generated in a scintillator, when a scintillator layer is formed to be thick as 500 μm or more, as shown in FIG. 13, there has been a case where very large irregularities having a maximum height of about 150 μm and a diameter of 1000 μm or more are formed by the abnormal growth as shown in FIG. 13. There has been a possibility that huge irregularities are formed in a concave/convex portion 122 abnormally grown from foreign matters 141.

In the above-described method, it is difficult to completely remove the huge splash, a part of the splash is left on a scintillator surface, and accordingly problems described in known examples cannot be completely solved.

Moreover, even when any splash is not left on the scintillator surface, an abnormal growth portion such as a huge splash exists inside a scintillator layer, and therefore problems have remained unsolved such as drop of luminance and deterioration of resolution with respect to X-rays in a region where the abnormal growth portion exists, although the problems by the abnormal growth portion inside the scintillator layer have not been described in the known example.

Therefore, an object of the present invention is to provide a scintillator in which there is not any irregularity on the surface of a scintillator layer and in which an abnormal growth portion such as splash existing inside the scintillator layer has been controlled to be very small, and a radiation detection device using the scintillator, thereby further enhancing quality of the radiation detection device.

According to the present invention, there is provided a radiation detection device comprising: a sensor panel (100) including a photoelectric conversion unit comprising a plurality of photoelectric conversion elements (102) arranged one-dimensionally or two-dimensionally on a substrate; and, a scintillator (130) which is disposed on the sensor panel (100) and which converts radiation into light detectable by the photoelectric conversion elements, wherein the scintillator comprising a structure in which of a plurality of scintillator layers (131, 132, 135) having columnar crystal structures are stacked with.

According to the present invention, there is provided a radiation detection device further comprising light-transmitting intermediate layers (138, 139) disposed among the plurality of scintillator layers (131, 132, 135) are alternately stacked with.

According to the present invention, there is provided a scintillator panel comprising: a support member (111, 112, 115); and, a scintillator (130) which is disposed on the support member (111, 112, 115) and which converts radiation into light, wherein the scintillator (130) comprises a structure in which a plurality of scintillator layers (131, 132, 135) having columnar crystal structures are stacked with.

According to the present invention, there is provided a scintillator panel further comprising light-transmitting intermediate layers (138, 139) disposed among the plurality of scintillator layers (131, 132, 135) are alternately stacked with.

According to the present invention, there is also provided a method of making a radiation detection device, comprising: a first deposition step of depositing a first scintillator layer (131) having a columnar crystal structure on a sensor panel (100) having a photoelectric conversion unit comprising a plurality of photoelectric conversion elements (102) arranged one-dimensionally or two-dimensionally on a substrate; and a second deposition step of depositing a second scintillator layer (132) having a columnar crystal structure on the first scintillator layer (131).

According to the present invention, there is also provided a method of making a scintillator panel, comprising: a first deposition step of depositing a first scintillator layer (131) having a columnar crystal structure on a support member (111, 112, 115); and a second deposition step of depositing a second scintillator layer (132) having a columnar crystal structure on the first scintillator layer (131).

BEST MODE FOR CARRYING OUT THE INVENTION

Figure 11:
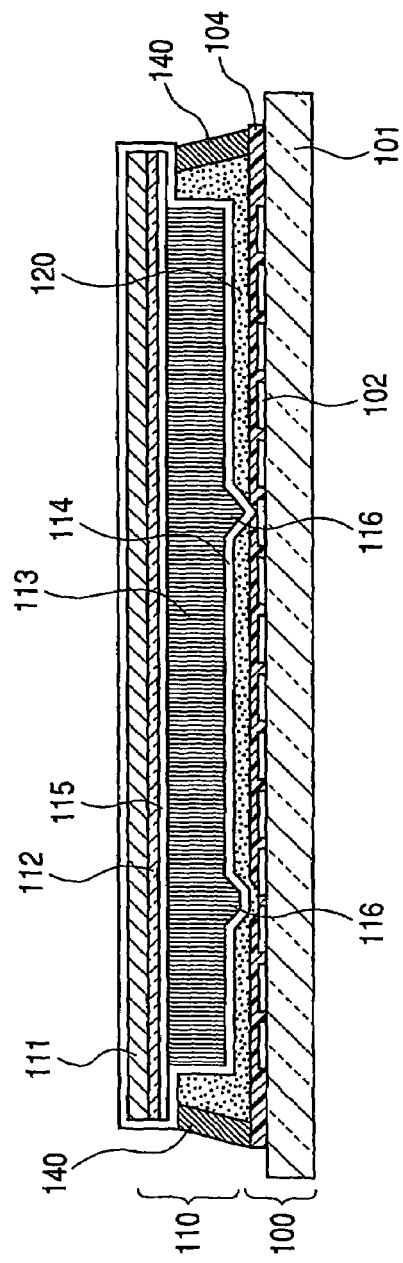
FIG. 11 is a cross-sectional view of a radiation detection device of a conventional example.
Figure 12:
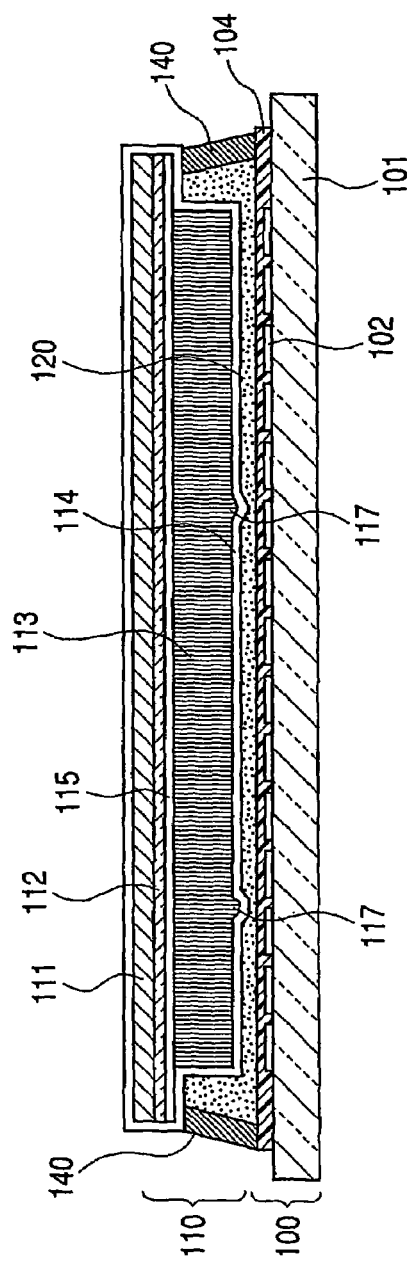
FIG. 12 is a cross-sectional view of the radiation detection device of the conventional example.
Figure 13:
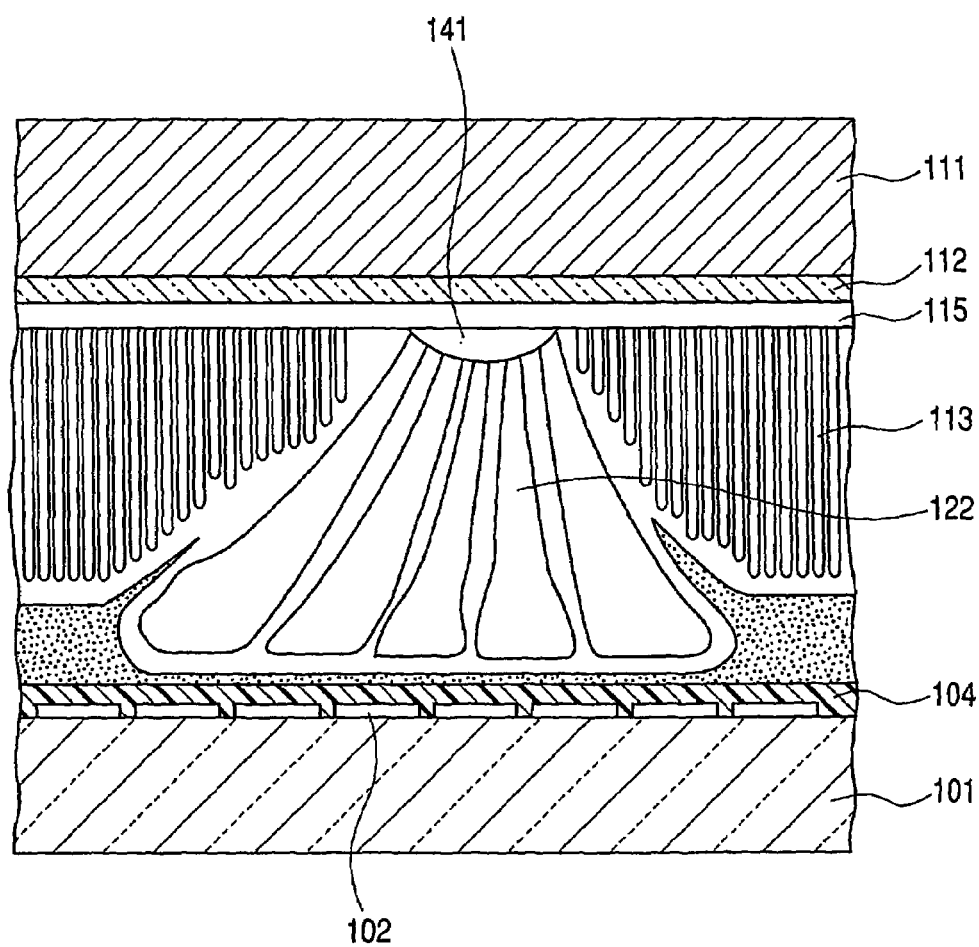
FIG. 13 is a cross-sectional view showing a projective portion formed by abnormal growth of a scintillator material of the radiation detection device of the conventional example.

Best modes for carrying out a radiation detection device, a method of making the device, a making apparatus, a scintillator panel, and a radiation image pick-up system according to the present invention will be described hereinafter in detail with reference to the drawings. It is to be noted that constituting elements similar to those of FIG. 11 to FIG. 13 described above are denoted with the same reference numerals, and description is simplified or omitted.

In a basic concept of the present invention, abnormal growth portions (concave/convex portion, projective portion) growing during vapor deposition of a scintillator layer (e.g., CsI:Tl) having columnar crystals are reduced in a radiation detection device having the above-described scintillator material and a photoelectric conversion panel.

First Embodiment

In Embodiment 1, the present invention is carried out as a radiation detection device and a method of making the device in a case where CsI:Tl (scintillator layer) is vapor-deposited directly on a photoelectric conversion panel (sensor panel) (referred to also as "direct vapor deposition type").

Figure 1:
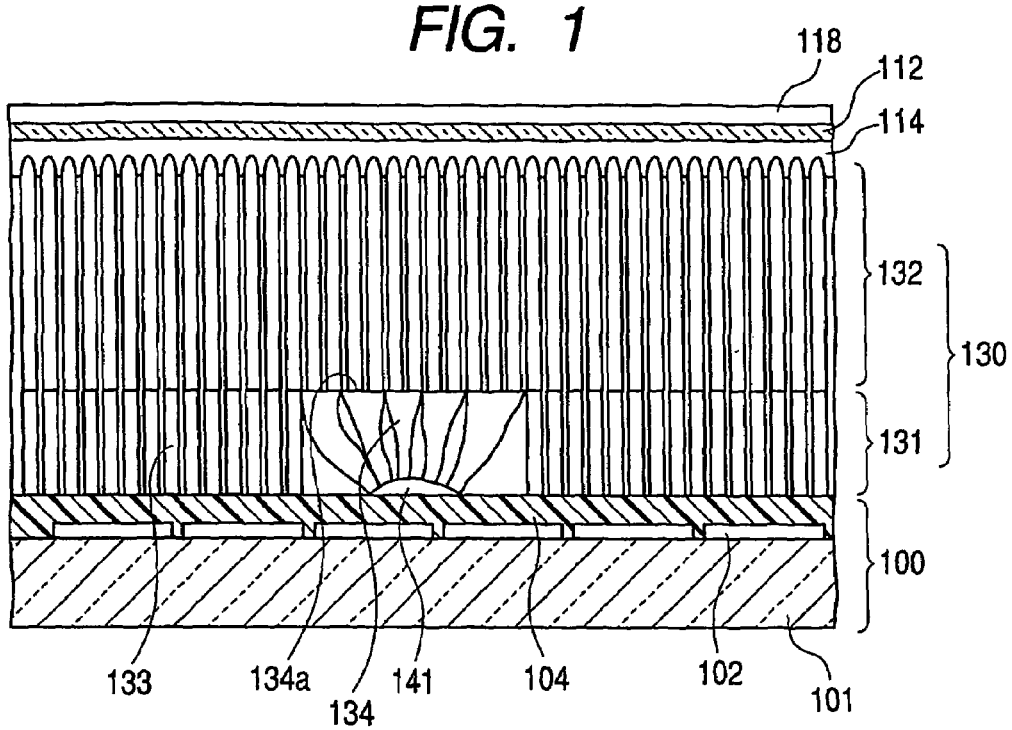
FIG. 1 is a cross-sectional view of a radiation detection device according to Embodiment 1 of the present invention.

The radiation detection device shown in FIG. 1 has: a photoelectric conversion panel 100; a scintillator layer 130 constituted of CsI:Tl formed by direct vapor deposition on the photoelectric conversion panel 100; a protective layer 114 formed on the scintillator material 130; a reflective layer 112 constituted of an aluminum thin film; and a protective layer 118.

The photoelectric conversion panel 100 shown in FIG. 1 comprises: a glass substrate 101; a photoelectric conversion element portion 102 constituted of a photo sensor and a thin-film transistor (TFT) using amorphous silicon (a-Si); and a protective layer 104 formed of silicon nitride and the like to protect the photoelectric conversion element portion 102. In the photoelectric conversion element portion 102, the photo sensor and the TFT formed in the same layer, or a mutually stacked structure of them may be applied.

X-rays which have fallen downwards from above in FIG. 1 pass through the protective layer 118, reflective layer 112, and protective layer 114, and are absorbed by the scintillator layer 130, and thereafter the scintillator layer 130 emits visible light. Since the visible light travels through the scintillator layer 113 on the photoelectric conversion panel 160 side, the light enters the photoelectric conversion element portion 102 through the protective layer 114 without diffusing. In the photoelectric conversion element portion 102, the incident visible light is converted into an electric signal, and read to the outside through a wiring portion (not shown) by switching. In this manner, incident X-ray information is converted into a two-dimensional digital image by the X-ray detection device shown in FIG. 1.

In the above-described constitution, the scintillator layer 130 has a first scintillator layer (CsI:Tl initially grown portion) 131 constituted of CsI:Tl crystallized/grown into columnar shapes by first vapor deposition. The first scintillator layer 131 includes an abnormal growth portion 134 in addition to a normally crystallized/grown normal portion 133. The abnormal growth portion 134 is abnormally grown by foreign matters 141 attached to the substrate 101 of the photoelectric conversion panel 100, and projections (not shown) which are concave/convex portions are formed on a surface 134a in an initial stage. The projections are crushed or treated otherwise in the subsequent projection treatment step, and accordingly flattened. The vapor deposition is performed again with respect to the first scintillator layer 131 in which the surface 134a of the abnormal growth portion 134 has been flattened, and accordingly a second scintillator layer (grown portion in CsI:Tl vapor re-deposition) 132 constituted of CsI:Tl grows on the first scintillator layer in a state in which column diameters are uniform.

Accordingly, it is finally possible to produce a region having a state in which a filling factor of the scintillator layer is not conspicuously small as compared with a normal portion 133 even in a place where the abnormal growth has started.

Figure 2:
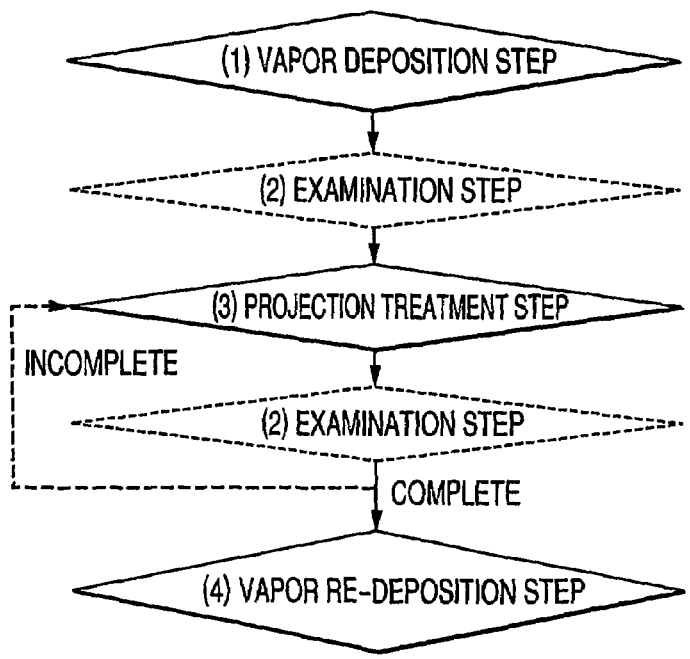
FIG. 2 is a flowchart showing a process of making the radiation detection device according to Embodiment 1 of the present invention.
Figure 3A:
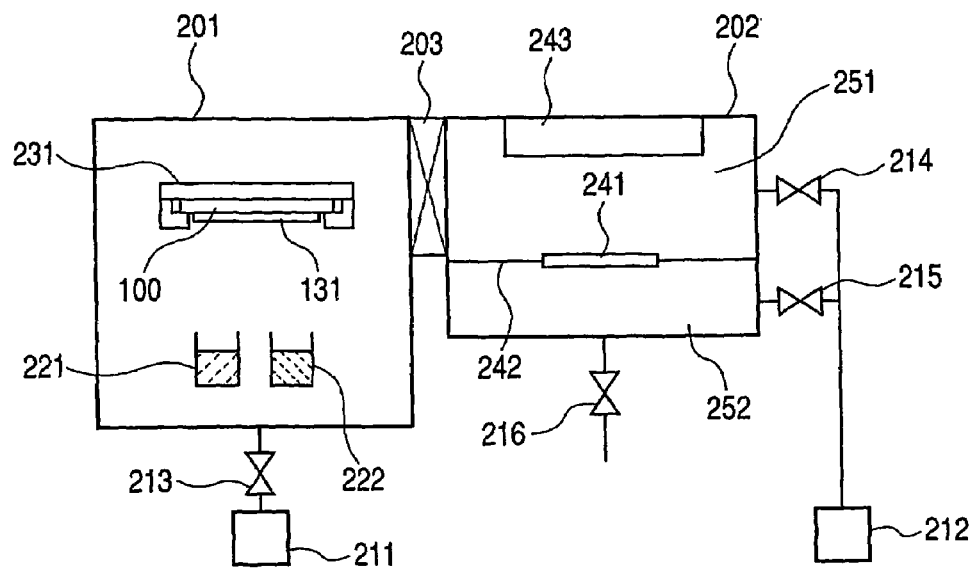
FIGS. 3A and 3B are schematic cross-sectional views of a making apparatus for use in the process of making the radiation detection device according to Embodiment 1 of the present invention.
Figure 3B:
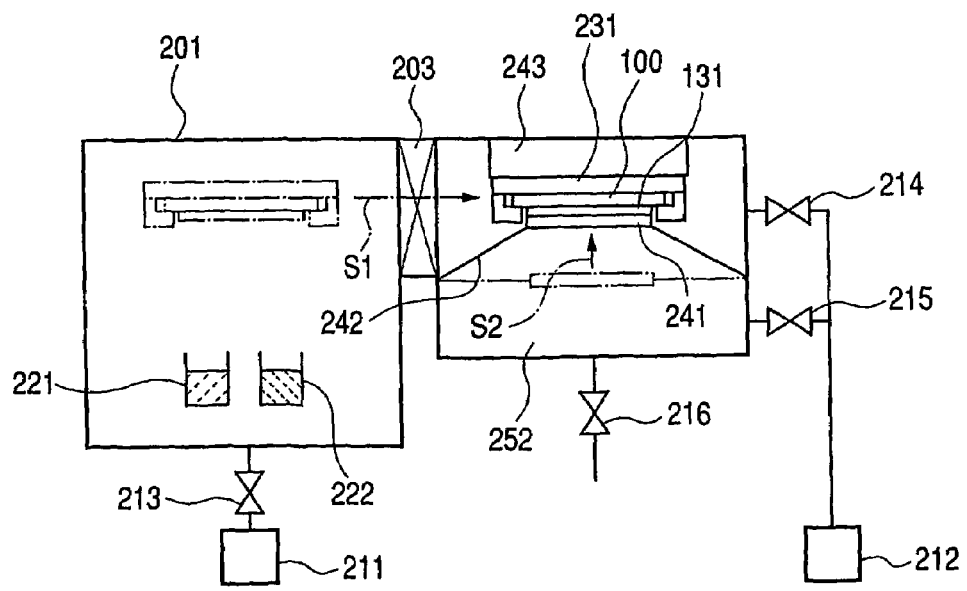

In a method of making the scintillator layer according to the first embodiment, basically making flows of 1) a vapor deposition step, 2) an examination step, 3) a projection treatment step, and 4) a vapor re-deposition step are performed. Additionally, 2) the examination step is not an indispensable making flow, and the whole surface of the scintillator layer may be subjected to 3) the projection treatment step without performing the examination step. Here, the projection treatment step, or the examination step and the projection treatment step form a step of flattening the concave/convex portion of the scintillator layer of the present embodiment. In these steps, when one projection treatment step is not sufficient, two or three of the examination, projection, and vapor re-deposition steps may be repeated a plurality of times. FIG. 1 shows a making flow of the present invention. Here, steps shown by broken lines do not have to be necessarily performed in the flow shown in FIG. 2. FIGS. 3A and 3B show an example of a making apparatus for use in the making process of the present embodiment. The present making apparatus entirely comprises two chambers, and comprises a vapor deposition chamber 201 and a projection chamber 202. The respective chambers 201, 202 are connected to vacuum pumps 211, 212 via valves 213, 214, 215, and vacuum can be drawn. The projection chamber 202 is connected to a pushing flat plate 241 via a partition rubber sheet 242, and the projection chamber 202 is partitioned into a treatment area 251 and a pressurizing area 252. Atmospheric air can be projected into the pressurizing area 252 via a valve 216. The respective steps will be described hereinafter.

(Vapor Deposition Step)

In the present vapor deposition step, the scintillator layer having a columnar crystal structure is stacked/formed by vapor deposition.

As materials of the scintillator layer, alkali halide metals such as CsI:Na, CsI:Tl, and CsBrTl are used. The scintillator material is selected in accordance with a wavelength of light-receiving sensitivity of a photoelectric conversion element. In the following example, the use of CsI:Tl as the scintillator material will be described. To form a scintillator, CsI:Tl is crystallized and formed into columnar shapes by codeposition of cesium iodine (CsI) and thallium iodine (TlI). After the formation, the scintillator layer is thermally treated, for example, at 200° C. in order to stabilize an emission state.

In the vapor deposition step, as shown in FIG. 3A, first vapor deposition is performed in the vapor deposition chamber 201. In the vapor deposition chamber 201, with respect to the photoelectric conversion panel 100 attached to a holder 231, a CsI heating boat 222 in which CsI is charged, and a TlI heating boat 221 in which TlI is charged are heated, and the vapor deposition is performed in a usual method. By this vapor deposition, the first scintillator layer (CsI:Tl) 131 is crystallized/grown into a columnar shape and formed on the photoelectric conversion panel 100. At this time, in the projection chamber 202, the valves 214, 215 are opened to entirely draw the vacuum. After a certain time, the vapor deposition is stopped once, a gate valve 203 is opened, and the holder 231 to which the photoelectric conversion panel 100 is attached is transferred to the treatment area 251 (see S1 of FIG. 3B).

(Examination Step)

In the present examination step, an address of a position where the scintillator layer formed in the vapor deposition step has started abnormal growth is inspected and specified.

The address at which the abnormal growth has started may be specified using a line sensor in a method. The image read by the line sensor is analyzed, an abnormal position is judged, and the address is registered, and used in the subsequent projection treatment step in the general method. Additionally, since CsI:Tl has high deliquescence, the operation is preferably performed in a low-humidity atmosphere. In a usual operation area, humidity is lowered below around 50% which is a humidity of a general clean room atmosphere, and the operation needs to be quickly performed. In a special chamber, when the operation is performed in an inactive gas which does not contain any moisture of N2 or the like, or in a vacuum atmosphere, an operation time does not have to be limited. On the other hand, as described later, this does not apply in a case where any address information is not required in the treatment of the projections.

(Projection Treatment Step)

In the present projection treatment step, the projections (irregularities) are flattened based on address information of the abnormal growth of the scintillator layer specified in the examination step. In the present projection treatment step, the projections may be flattened with respect to the whole surface of the scintillator layer without performing the examination step.

Means for treating the projections may be methods such as crushing, and melting at high temperature using laser or the like.

For example, to crush the projections, there are a method in which the projections are aligned one by one from the address information of the projections, and crushed with an exclusive-use jig, and a method in which the projections are crushed at once with a flat plate on the whole surface without using any address information. In the former method, there is a merit that crushing conditions are adapted in accordance with sizes of the projections, and the number of steps is large. In the latter method, the number of the steps is extremely small, but the crushing conditions cannot be adapted for each projection. The respective methods have advantages and disadvantages, but may be selected in accordance with requirements of the step.

Moreover, when the projections are molten at high temperature using laser or the like, the address information is required. As compared with the crushing, the projections are locally exposed at the high temperature, and therefore the method should be used in a hardly influenced constitution.

Furthermore, instead of flattening the projections (irregularities) of the first scintillator layer, a flattening layer may be separately disposed on the surface of the first scintillator layer having the projections in order to flatten the surface. In the present invention, the step of disposing the flattening layer is also included in the projection treatment step.

An example of the projection treatment step will be described with reference to FIG. 3B.

As shown in FIG. 3B, the valve 215 only is closed, subsequently the valve 216 is opened to project the atmospheric air, the pressurizing area is gradually pressurized in a direction of an atmospheric pressure, then the pushing flat plate 241 is pushed toward the holder 231, and the partition rubber sheet 242 stretches (see two-dot chain line arrow S2 of FIG. 3B). Accordingly, the surface of the first scintillator layer (CsI:Tl) 131 on the photoelectric conversion panel 100 is pressed as such. Since a support stage 243 is disposed on an opposite side, the first scintillator layer (CsI:Tl) 131 is pressed with a pressure as such, and the projections are crushed.

(Vapor Re-deposition Step)

In the present vapor re-deposition step, the vapor deposition is performed again on the scintillator layer flattened in the projection treatment step or the flattening layer.

To continue the vapor deposition again from a state in which the projections have been treated, the vapor deposition may be usually started, and does not have to be especially devised. Nearly normal columns grow from portions subjected to the projection treatment. The columns grow as such in the normal portion. The surface of the scintillator layer subjected to the vapor re-deposition may be flattened as performed in the Japanese Patent Application Laid-Open Nos. 2003-66196 and 2002-243859, or in the projection treatment step. A method in which the surface of the scintillator layer is flattened as described in the Japanese Patent Application Laid-Open No. 2003-66196, or a method in which the scintillator layer is coated with a protective layer, and the protective layer is flattened as described in information Japanese Patent Application Laid-Open No. 2002-243859 may be used.

As an example of the vapor re-deposition step, in the apparatus in FIGS. 3A, 3B, the holder 231 to which the photoelectric conversion panel 100 is attached is returned to the vapor deposition chamber 201, and the first scintillator layer 131 on the photoelectric conversion panel 100 may be subjected to the vapor deposition again on the same conditions as those of the above-described vapor deposition step. Accordingly, a second scintillator layer (CsI:Tl) is formed on the first scintillator layer 131 subjected to the projection treatment. Here, an example in which the second scintillator layer is formed on the first scintillator layer 131 subjected to the projection treatment has been described, but the present invention is not limited to the example, and the second scintillator layer may be formed on the flattening layer disposed, for example, on the first scintillator layer.

When the present invention is performed in this method, it is possible to easily perform the operation without exposing the scintillator (CsI:Tl) being subjected to the vapor deposition to the atmospheric air. It is to be noted that even when separate apparatuses may be used in the absence of this apparatus capable of performing collective treatment, the present invention is not denied.

Second Embodiment

FIG. 4, FIGS. 5A to 5C show Embodiment 2. In Embodiment 2, the present invention is carried out as a radiation detection device and a method of making the device in a case where CsI:Tl is vapor-deposited on a substrate to form a scintillator panel, and the scintillator panel is bonded to a photoelectric conversion panel (referred to also as "laminated type").

Figure 4:
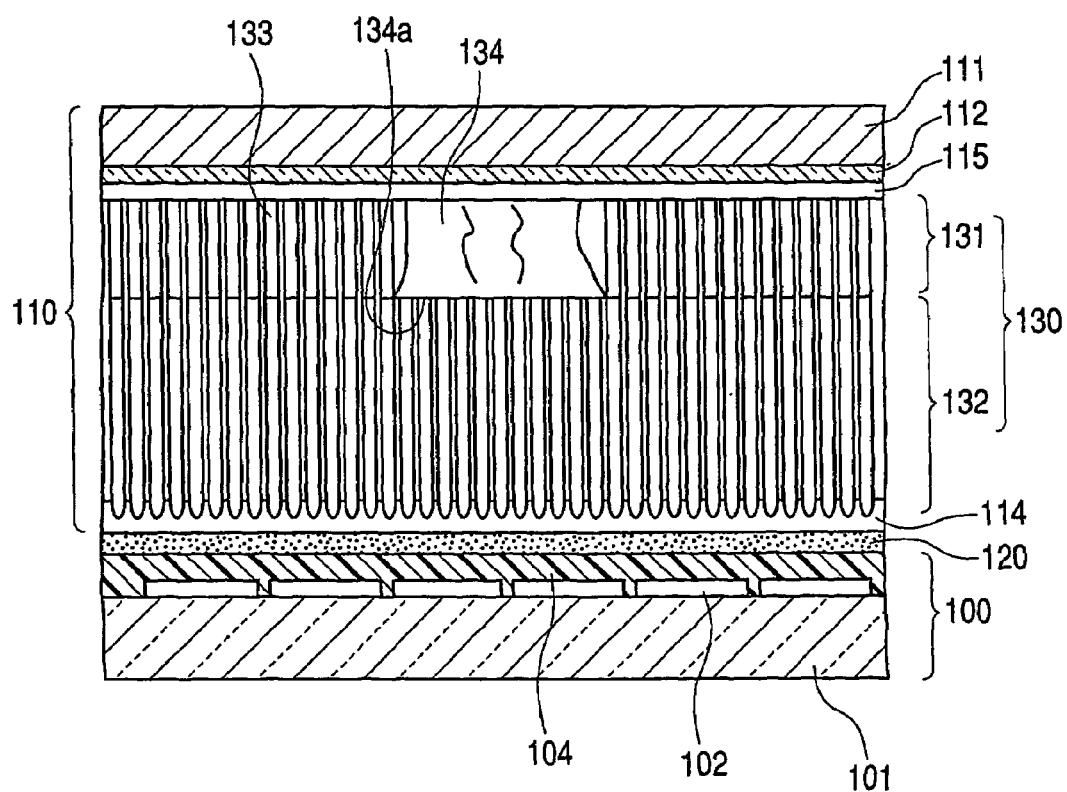
FIG. 4 is a cross-sectional view of the radiation detection device according to Embodiment 2 of the present invention.

FIG. 4 shows a cross-sectional structure of the radiation detection device of Embodiment 2.

The radiation detection device shown in FIG. 4 has: a photoelectric conversion panel (sensor panel) 100; and a scintillator panel (fluorescent plate) 110.

The photoelectric conversion panel 100 comprises: a glass substrate 101; a photoelectric conversion element portion 102 constituted of a photo sensor and a thin-film transistor (TFT) using amorphous silicon; and a protective layer 104 formed of silicon nitride and the like to protect the photoelectric conversion element portion 102.

The scintillator panel 110 comprises: a scintillator layer 130 constituted of a scintillator crystallized into a columnar shape; a substrate 111 for supporting the scintillator layer 130; a reflective layer 112 constituted of an aluminum thin film which reflects light converted by the scintillator layer 130 on the side of the photoelectric conversion panel 100; a protective layer 115 for protecting the reflective layer; and a protective layer 114 formed of an organic resin to protect the scintillator layer 131 and the like from outside air.

The photoelectric conversion panel 100 is bonded to the scintillator panel 110 by an adhesive layer 120, and the periphery is sealed by a sealing material 140. Here, a thickness of each layer which transmits the light needs to be correctly controlled in order to prevent resolution from being scattered. Especially, the adhesive layer 120 needs to be prevented from being excessively thick. The adhesive layer 120 is applied between the sensor panel 100 and the scintillator panel 110, thereafter they are entirely drawn with a roller, and the panels are bonded in such a manner that the adhesive layer 120 is prevented from being thickened.

X-rays which have fallen downwards from above in FIG. 4 pass through the substrate 111, reflective layer 112, and protective layer 115, and are absorbed by the scintillator layer 130, and thereafter the scintillator layer 130 emits visible light. Since the visible light travels through columnar crystals of the scintillator layer 130 on the sensor panel 100 side, the light enters the photoelectric conversion element portion 102 through the protective layer 114, adhesive layer 120, and protective layer 104 without diffusing.

In the photoelectric conversion element portion 102, the incident visible light is converted into an electric signal, and read to the outside through a wiring portion (not shown) by switching. In this manner, incident X-ray information is converted into a two-dimensional digital image by the X-ray detection device shown in FIG. 4.

In the above-described constitution, the scintillator layer 130 has a first scintillator layer (CsI:Tl initial grown portion) 131 constituted of CsI:Tl crystallized/grown into columnar shapes by first vapor deposition. The first scintillator layer 131 includes an abnormal growth portion 134 in addition to a normally crystallized/grown normal portion 133. The abnormal growth portion 134 is abnormally grown at a vapor deposition time, and projections (not shown) which are concave/convex portions are formed on a surface 134a in an initial stage. The projections are molten with laser or treated otherwise in the subsequent projection treatment step, and accordingly flattened. The vapor deposition is performed again with respect to the first scintillator layer 131 in which the surface 134a of the abnormal growth portion 134 has been flattened, and accordingly a second scintillator layer (grown portion in CsI:Tl vapor re-deposition) 132 constituted of CsI:Tl grows on the first scintillator layer in a state in which column diameters are uniform.

The radiation detection device of the present embodiment is completed, when the protective layer 114 is formed on the scintillator layer (CsI:Tl) constituted of the first scintillator layer 131 and the second scintillator layer 132 formed as described above to entirely prepare the scintillator panel 110, and thereafter the scintillator panel 110 is laminated onto the photoelectric conversion panel 100.

Figure 5A:
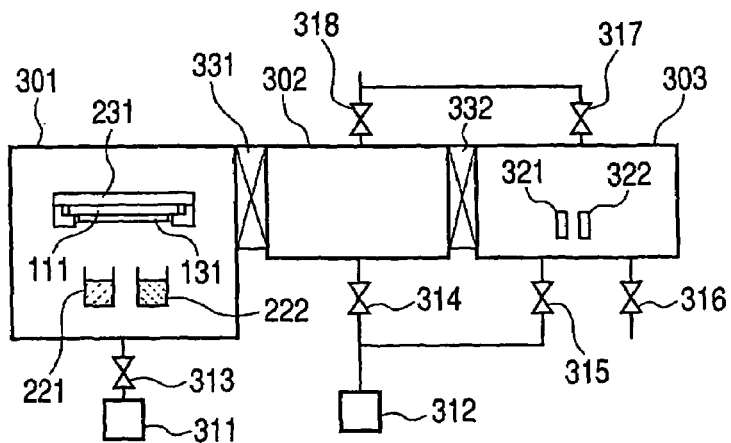
FIGS. 5A, 5B and SC are schematic cross-sectional views of the making apparatus for use in the process of making the radiation detection device according to Embodiment 2 of the present invention.
Figure 5B:
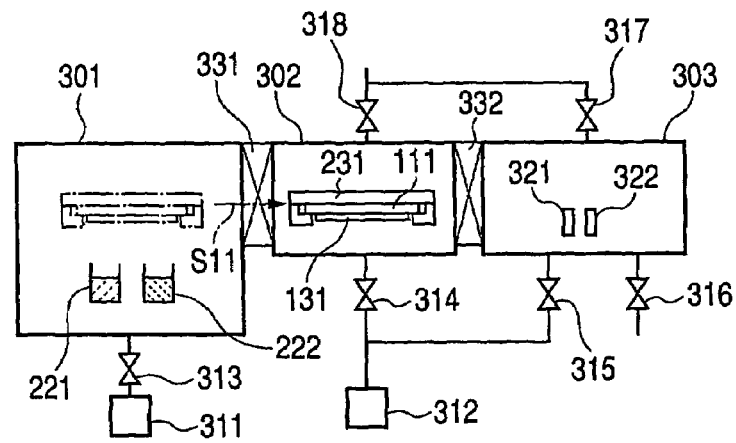

FIGS. 5A and 5B show a making apparatus for use in the making process of the present embodiment.

As shown in FIGS. 5A and 5B, the making apparatus for use in the present process entirely comprises three chambers, and comprises a vapor deposition chamber 301, a buffer chamber 302, and a projection chamber 303. The respective chambers 301, 302, 303 are connected to vacuum pumps 313, 312 via valves 313, 314, 315, and vacuum can be drawn. In the projection chamber 303, a line sensor 321 and a laser irradiation device 322 are disposed.

A method of making a scintillator layer having a columnar crystal structure in the present embodiment will be described hereinafter with reference to FIGS. 5A and 5B.

(Vapor Deposition Step)

As shown in FIG. 5A, first vapor deposition has been described in Embodiment 1. That is, in the vapor deposition chamber 301, with respect to the substrate 111 attached to a holder 231, a CsI heating boat 222 in which CsI is charged, and a Tll heating boat 221 in which Tll is charged are heated, and the vapor deposition is performed in a usual method. By this vapor deposition, the first scintillator layer (CsI:Tl) 131 is crystallized/grown into a columnar shape and formed on the substrate 111.

At this time, in the buffer chamber 302, the valve 314 is opened to draw the vacuum.

After the vapor deposition ends, as shown in FIG. 5B, a gate valve 331 is opened, and the holder 231 to which the substrate 111 is attached is transferred to a buffer chamber 302 side (see two-dot chain line arrow S11). In this state, the vacuum drawing of the buffer chamber 302 is stopped, a valve 318 is opened, and N2 is projected to return to an atmospheric pressure.

Figure 5C:
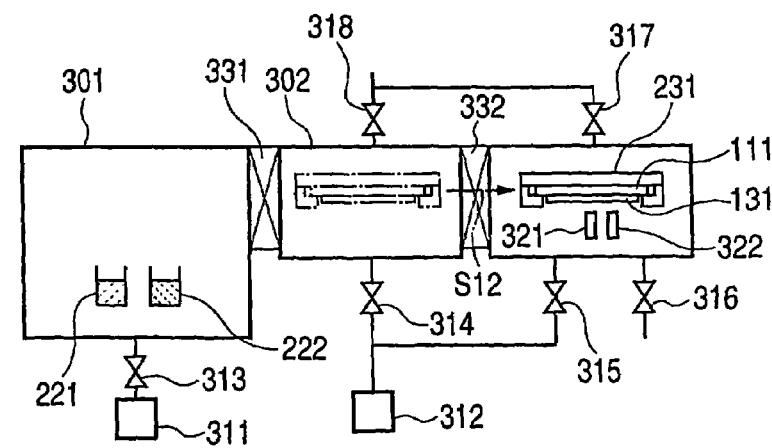

In this stage, the projection treatment chamber 303 is brought into an N2 atmosphere beforehand in an atmospheric state, a gate valve 332 is opened as such, and the holder 231 to which the substrate 111 has been attached is moved to a projection treatment chamber 303 side as shown in FIG. 5C (see two-dot chain line arrow S12).

Here, in a method of bringing the projection treatment chamber 303 into the N2 atmosphere, valves 317, 316 may be simultaneously opened to pass N2, or N2 may be sealed in the projection treatment chamber 303. The projection treatment chamber 303 is connected to the vacuum pump 312 via the valve 315 in order to easily replace a gas during the sealing.

(Examination and Projection Treatment Step)

Next, projections are treated with respect to the first scintillator layer 131 on the substrate 111 attached to the holder 231 in the projection treatment chamber 303.

To treat the projections, first an optical image of the whole surface of the first scintillator layer 131 is read with the line sensor 321, image processing is performed with respect to a difference of contrast on the optical image, accordingly the projections (concave/convex portion) on the surface of the abnormal growth portion formed in the first scintillator layer 131 is detected, and an address indicating the position and size information are obtained. Moreover, laser is applied from the laser irradiation device 322 in such a manner as to melt projective portions on the surface of the abnormal growth portion on the first scintillator layer 131 on laser irradiation conditions capable of melting the projective portions based on the information, and the surface is flattened to thereby complete the step.

(Vapor Re-deposition Step)

An operation reverse to the above-described operation may be performed in vapor re-deposition. That is, the holder 231 to which the substrate 111 is attached is returned to the vapor deposition chamber 301 via the buffer chamber 302, and the vapor deposition may be performed again with respect to the first scintillator layer 131 on the substrate 111 on the same conditions as those of the vapor deposition step.

Accordingly, a second scintillator layer (CsI:Tl) is formed on the first scintillator layer 131 subjected to the projection treatment.

When the present invention is carried out in this method, the scintillator (CsI:Tl) being vapor-deposited can further be treated without being exposed to humidity.

Even when separate apparatuses may be used in the absence of this apparatus capable of performing the collective treatment, the present invention is not denied.

It is to be noted that in the above-described embodiment, the scintillator layer comprises two layers: the lower first scintillator layer 131; and the upper second scintillator layer 132, but the number of layers is not limited, and two or more layers may be formed. For example, when the abnormal growth portion is also crystallized/grown on the second scintillator layer 132 to form the projections on the surface, the projections may be treated during the vapor deposition in the same manner as in the first scintillator layer 131, and a third scintillator layer may be newly vapor-deposited again after the treatment.

Third Embodiment

Figure 6:
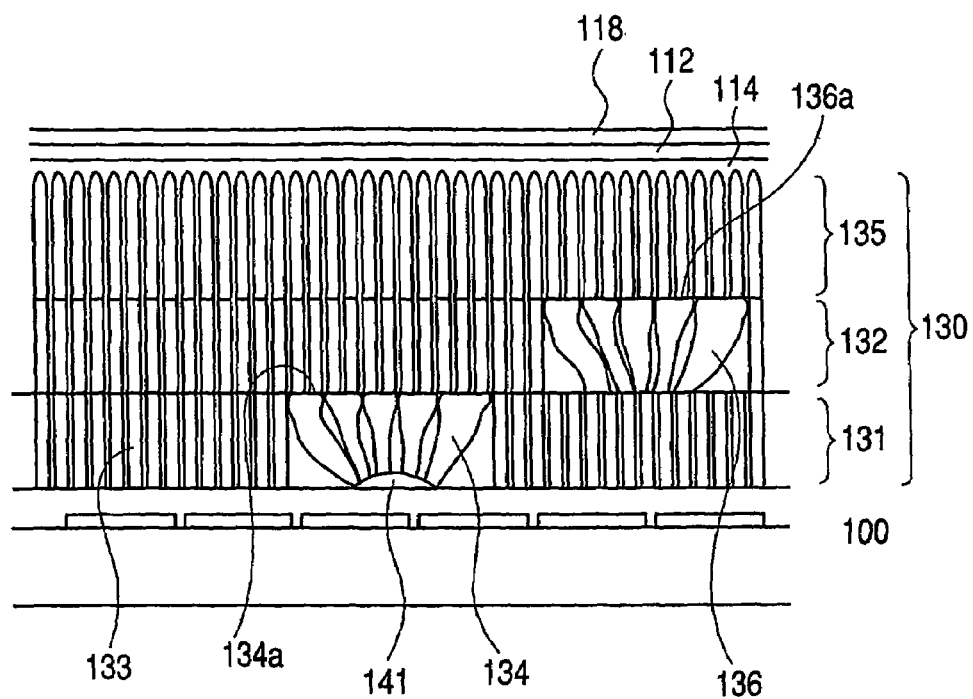
FIG. 6 is a cross-sectional view of the radiation detection device according to Embodiment 3 of the present invention.

FIG. 6 shows Embodiment 3. The present embodiment shows an example in which the projection treatment during the vapor deposition is performed with respect to a second scintillator layer 132 in the same manner as in a first scintillator layer 131, and a third scintillator layer 137 is newly vapor-deposited again after the treatment. When abnormal growth portions 136 generated in the second scintillator layer 132 grow into crystals, and projections are formed on the surface of the second scintillator layer, a projection treatment step during the vapor deposition is performed in the same manner as in the first scintillator layer 131, the third scintillator layer 137 is newly vapor-deposited again after the treatment, and accordingly the surface can be flattened. When the scintillator layer is multilayered, and a thickness per layer of the scintillator layer is reduced in this manner, the projections that would be generated by the abnormal growth portions 136 are reduced, and it is possible to obtain more satisfactory flatness on the surface of the scintillator layer. Here, either of the projection treatment steps described in Embodiments 1 and 2 may be used in the projection treatment step of the present embodiment.

Moreover, in the above-described embodiments, as means for flattening the projective portions (concave/convex portions) on the surface of the scintillator layer, the case where the projective portions are crushed from above using the flat plate (Embodiment 1) and the case where the projective portions are molten with laser (Embodiment 2) have been described, but the present invention is not limited, and, for example, the projective portions may be polished or removed, for example, by a rotary polishing machine or the-like, or the projective portions may be cut by sharp cutting means. The use of the line sensor (Embodiment 2) has been described as means for inspecting the surface of the scintillator layer, but the present invention is not limited to this. A light source is combined with a photo sensor, and irregular reflection from the projective portions may be read with the photo sensor.

Fourth Embodiment

Figure 7:
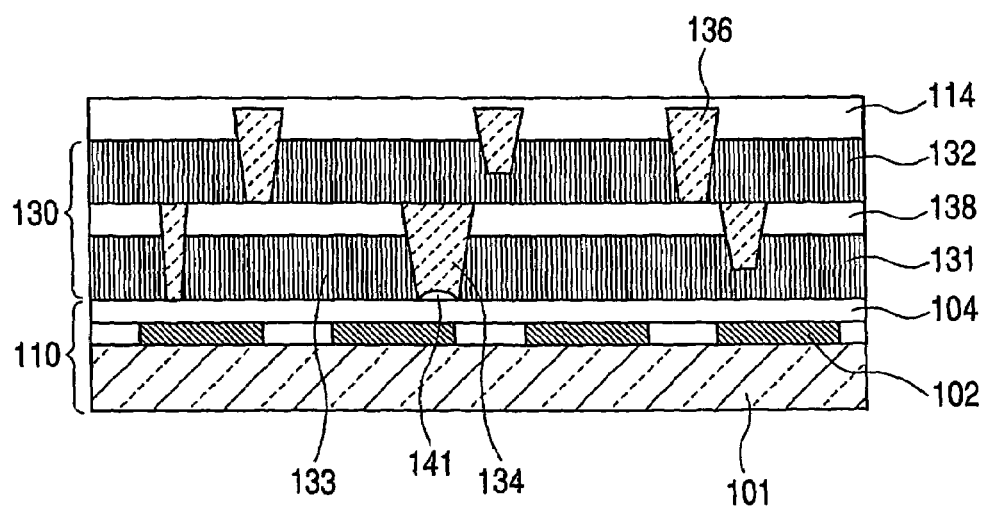
FIG. 7 is a cross-sectional view of the radiation detection device according to Embodiment 4 of the present invention.

FIG. 7 shows a cross-sectional view of a radiation detection device according to Embodiment 4.

In Embodiment 4, the present invention is carried out as a radiation detection device in a case where CsI:Tl (scintillator layer) is directly vapor-deposited on a sensor panel (photoelectric conversion panel) (referred to also as the "direct vapor deposition type").

The radiation detection device shown in FIG. 7 has: a photoelectric conversion panel 100; a scintillator layer 130 constituted of CsI:Tl formed by direct vapor deposition on the photoelectric conversion panel 100; a protective layer 114 formed on the scintillator 130; a reflective layer (not shown) constituted of an aluminum thin film; and a protective layer (not shown).

The photoelectric conversion panel 100 shown in FIG. 7 comprises: a glass substrate 101; a photoelectric conversion element portion 102 constituted of a photo sensor using amorphous silicon (a-Si) and a thin-film transistor (TFT); and a protective layer 104 formed of silicon nitride and the like to protect the photoelectric conversion element portion 102. In the photoelectric conversion element portion 102, the photo sensor and the TFT formed in the same layer, or a mutually stacked structure of them may be applied.

X-rays which have fallen downwards from above in FIG. 7 pass through the protective layer (not shown), reflective layer (not shown), and protective layer 114, and are absorbed by the scintillator layer 130, and thereafter the scintillator layer 130 emits visible light. Since the visible light travels through columnar crystals of the scintillator layer 130 on the photoelectric conversion panel 100 side, the light enters the photoelectric conversion element portion 102 through the protective layer 114 without diffusing. In the photoelectric conversion element portion 102, the incident visible light is converted into an electric signal, and read to the outside through a wiring portion (not shown) by switching. In this manner, incident X-ray information is converted into a two-dimensional digital image by the X-ray detection device shown in FIG. 7.

In the above-described constitution, the scintillator layer 130 has a first scintillator layer (CsI:Tl initial grown portion) 131 constituted of CsI:Tl crystallized/grown into columnar shapes by first vapor deposition. The first scintillator layer 131 includes an abnormal growth portion 134 in addition to a normally crystallized/grown normal portion 133. The abnormal growth portion 134 is abnormally grown by foreign matters 141 attached to the substrate 101 of the photoelectric conversion panel 100, and projections (not shown) which are concave/convex portions are formed on a surface in an initial stage. Surface irregularities are reduced by an intermediate layer 138 disposed on the first scintillator layer, and the projections are flattened. When the surface of the abnormal growth portion 134 is flattened by the intermediate layer 138, and the vapor deposition is performed again on the intermediate layer 138 in this manner, a second scintillator layer (grown portion in CsI:Tl vapor re-deposition) 132 constituted of CsI:Tl grows on the intermediate layer in a state in which column diameters are uniform.

Since the first scintillator layer 131 and the second scintillator layer 132 constituting a multilayered structure via the intermediate layer 138 are formed as described above, growth of the abnormal growth portion 134 including splash generated in the first scintillator layer 131 stops in the intermediate layer 138. Moreover, the surface of the intermediate layer 138 on which the second scintillator layer starts growing by the intermediate layer 138 is a flat surface. Therefore, the abnormal growth portion 134 is inhibited from being enlarged, and generation of abnormal growth portions 136 in the second scintillator layer 132 can be reduced. Furthermore, even when the abnormal growth portions 136 are generated in the second scintillator layer 132 formed on the intermediate layer 138, the growth starts in an initial stage, and the vapor deposition of the second scintillator layer 132 ends before the portions grow to be large. Therefore, the scintillator layer can be formed while the abnormal growth portions 136 do not largely grow.

As a thickness of the intermediate layer 138, the thickness needs to be optimized as a thickness required for reducing the projections of the abnormal growth portions to obtain the flat surface without deteriorating sharpness which is an X-ray characteristic of the scintillator.

The thickness of the intermediate layer 138 cannot be generally determined because the size of the abnormal growth portion 134 differs with vapor deposition conditions, but is 50 µm or less, preferably 30 µm or less in order to prevent drop of the sharpness of the radiation detection device. An experimentally obtained thickness of the scintillator layer is approximately 100 to 300 µm in a case where a size of the projection by the abnormal growth portion 134 is 50 µm or less.

The material of the intermediate layer 138 needs to have good transmission with respect to a wavelength of light emitted from the scintillator layer, have heat resistance capable of withstanding temperature of about 150 to 250° C. applied in an annealing step after forming the scintillator layer, and have a flat surface even when formed into a concave/convex surface.

As a concrete material of the intermediate layer 138 having the above-described characteristics, either an organic material or an inorganic material may be used. Examples of the organic material include an olefin-based resin, particularly a poly-para-xylylene resin (e.g., manufactured by Three Bond Co., Ltd.; trade name: Parylene, hereinafter referred to as Parylene), a polyimide resin, an acryl resin, an epoxy resin and the like. As the inorganic material, silicon oxide, silicon nitride, titanium oxide or the like is usable.

As a method of forming the intermediate layer 138, the layer can be formed by vacuum film forming processes such as thermal CVD, plasma CVD, and sputtering, and liquid coating processes such as spin coating, slit coating, and dip coating.

Moreover, the flattening layer is not limited to one layer, and a stacked constitution may be formed by two or more layers.

Furthermore, the thickness of one scintillator layer in the present invention differs with the material or preparing process of the scintillator as described above, but a thickness of about 100 to 300 µm is preferable as a thickness with which the abnormal growth portions 134, 136 do not largely grow. The thickness of the whole scintillator layer 130 is preferably approximately 400 to 700 µm in such a manner that radiations are efficiently absorbed, and the drop of the sharpness is in a usable range. The thickness of the abnormal growth portion 134, 136 which could be generated at a time when the scintillator layer has a thickness of 100 µm is 20 µm or less, and therefore the intermediate layer 138 preferably has a thickness of at least 20 µm.

The protective layer 114 for protecting the scintillator layer 130 from external environments is preferably formed on the scintillator layer 130 in such a manner that the scintillator layer 130 is coated. The material and the preparing process which have heretofore been known can be used in the protective layer 114.

Furthermore, it has heretofore been known that a reflective layer (not shown) and a layer (not shown) for protecting the reflective layer are stacked on the protective layer 114 in order to efficiently capture the light emitted from the scintillator layer in a photo detector, and this can be used in the device of the present invention.

Additionally, the abnormal growth portions 136 are restored on the protective layer 114 of the radiation detection device obtained in this manner, accordingly the height of the projection by the abnormal growth portion 136 can be further reduced, and a higher effect can be obtained. As a concrete method of restoration, in the same manner as in the Japanese Patent Application Laid-Open Nos. 2003-66196 and 2002-243859, there are a method of crushing the projections by the flat plate or the roller, a mechanically removing (polishing, cutting) method, and a removing or dissolving method by laser irradiation. It is to be noted that the protective layer 114 may be disposed after restoring the projections by the abnormal growth portions 136 of the second scintillator layer 132 as described above.

Furthermore, the intermediate layer 138 is constituted in such a manner that even the side surfaces of the first scintillator layer 131 are coated, and Parylene is used in the material of the intermediate layer 138. Then, the layer can have a humidity-resistant protective property with respect to the first scintillator layer 131 having the deliquescence. Moreover, the side surface of the second scintillator layer 132 is coated with the protective layer 114, or the side surfaces of the first scintillator layer 131, intermediate layer 138, and second scintillator layer 132 are collectively coated, especially Parylene is used as the material, and accordingly the humidity-resistant protective property can be achieved against the first scintillator layer 131 and second scintillator layer 132 having the deliquescence. The above-described constitution also has a similar effect with respect to a constitution in which a plurality of intermediate layers 138 and second scintillator layers 132 are alternately stacked.

A method of making the radiation detection device in the present embodiment will be described hereinafter.

The photoelectric conversion element portion 102 constituted of the photo sensor formed of a-Si and the TFT was formed on a nonalkali glass substrate which was the glass substrate 101 having a thickness of 1.0 mm, and a size of 500 mm square, and the protective layer 104 constituted of SiNx was formed on the portion to prepare the photoelectric conversion panel 110.

Next, cesium iodine (hereinafter referred to as CsI), and thallium iodine (hereinafter referred to as TlI) were vapor-deposited to achieve a thickness of 200 µm on the photoelectric conversion panel 110 by a vapor deposition process, and the first scintillator layer 131 (CsI:Tl) having the columnar crystal structure was formed. The abnormal growth portion 134 having a maximum diameter of 300 µm was generated on the surface of the formed first scintillator layer 131.

Next, Parylene was formed into a thickness of 15 µm on the first scintillator layer 131 by a thermal CVD process. Furthermore, a polyimide resin molten in a solvent was applied on Parylene by a slit coating process, dried, hardened, and formed into a thickness of 20 µm to form the intermediate layer 138 having a double-layer constitution of Parylene and polyimide.

Next, the second scintillator layer 132 was formed on the intermediate layer 138 by a material and a method similar to those of the first scintillator layer 131, and the scintillator layer 130 having a total thickness of about 500 µm was formed. After the layer was formed, the abnormal growth portion 136 having a diameter of 350 µm at maximum, and a height of 50 µm was generated on the surface of the second scintillator layer 132, but the portion was generated in a position different from that of the first scintillator layer 131, and continuity was not found.

The projections by the abnormal growth portions 136 were restored by the crushing which was the method of the known example, and the abnormal growth portions 136 were removed to such an extent that any projection was not recognized on the plane.

Finally, the protective layer 114 was formed by Parylene by the thermal CVD process in such a manner that the surface and side surfaces of the scintillator layer 130 were coated, and the radiation detection device shown in FIG. 7 was obtained.

Fifth Embodiment

Figure 8:
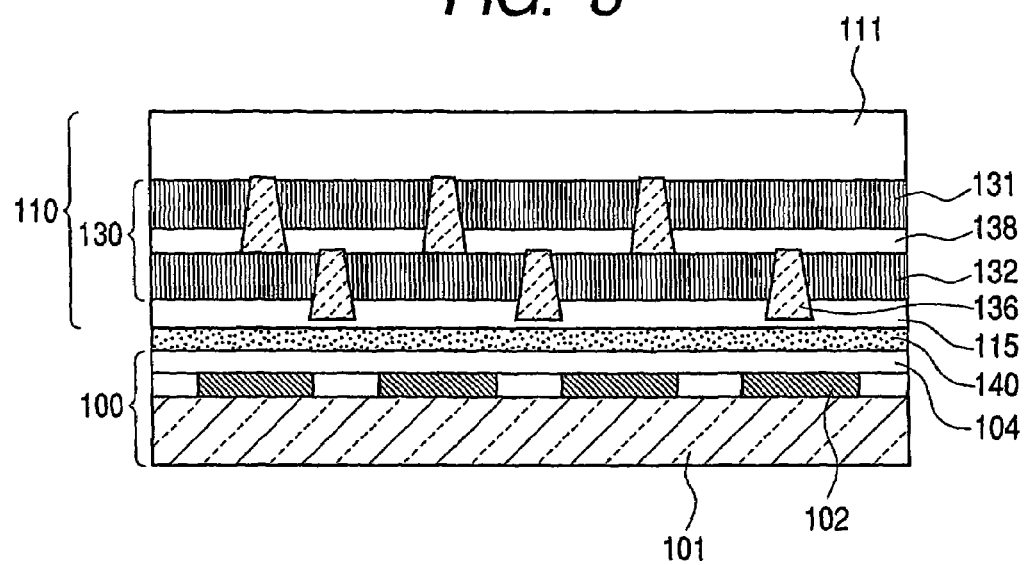
FIG. 8 is a cross-sectional view of the radiation detection device according to Embodiment 5 of the present invention.

FIG. 8 shows Embodiment 5. In Embodiment 5, the present invention is carried out as a radiation detection device and a method of making the device in a case where CsI:Tl is vapor-deposited on a substrate to form a scintillator panel, and the scintillator panel is laminated onto a photoelectric conversion panel (referred to also as the "laminated type").

FIG. 8 shows a cross-sectional structure of the radiation detection device of Embodiment 5.

The radiation detection device shown in FIG. 8 has: a photoelectric conversion panel (sensor panel) 100; and a scintillator panel (fluorescent plate) 110.

The photoelectric conversion panel 100 comprises: a glass substrate 101; a photoelectric conversion element portion 102 constituted of a photo sensor and a thin-film transistor (TFT) using amorphous silicon; and a protective layer 104 formed of silicon nitride and the like to protect the photoelectric conversion element portion 102.

The scintillator panel 110 comprises: a scintillator layer 130 constituted of a scintillator crystallized into a columnar shape; a substrate 111 for supporting the scintillator layer 130; a reflective layer (not shown) constituted of an aluminum thin film which reflects light converted by the scintillator layer 130 on the side of the photoelectric conversion panel 100; a scintillator underlayer (not shown) which is a growth starting surface of the scintillator layer 130; and a protective layer 115 formed of an organic resin to protect a scintillator layer 131 and the like from outside air.

The photoelectric conversion panel 100 is bonded to the scintillator panel 110 by an adhesive layer 120, and the periphery is sealed by a sealing material 140. Here, a thickness of each layer which transmits the light needs to be correctly controlled in order to prevent resolution from being scattered. Especially, the adhesive layer 120 needs to be prevented from being excessively thick. The adhesive layer 120 is applied between the sensor panel 100 and the scintillator panel 110, thereafter they are entirely drawn with a roller, and the panels are bonded in such a manner that the adhesive layer 120 is prevented from being thickened.

X-rays which have fallen downwards from above in FIG. 8 pass through the substrate 111, reflective layer (not shown), and scintillator underlayer (not shown), and are absorbed by the scintillator layer 130, and thereafter the scintillator layer 130 emits visible light. Since the visible light travels through columnar crystals of the scintillator layer 130 on the sensor panel 100 side, the light enters the photoelectric conversion element portion 102 through the protective layer 114, adhesive layer 120, and protective layer 104 without diffusing.

In the photoelectric conversion element portion 102, the incident visible light is converted into an electric signal, and read to the outside through a wiring portion (not shown) by switching. In this manner, incident X-ray information is converted into a two-dimensional digital image by the X-ray detection device shown in FIG. 8.

In the above-described constitution, the scintillator layer 130 has a first scintillator layer (CsI:Tl initial grown portion) 131 constituted of CsI:Tl crystallized/grown into columnar shapes by first vapor deposition. The first scintillator layer 131 includes an abnormal growth portion 134 in addition to a normally crystallized/grown normal portion 133. The abnormal growth portion 134 is abnormally grown at a vapor deposition time, and projections (not shown) which are concave/convex portions are formed on a surface 134a in an initial stage. As to the projections, surface irregularities are eased and flattened by an intermediate layer 138 disposed on the surface of the first scintillator layer. The surface of the abnormal growth portion 134 is flattened by the intermediate layer 138 in this manner, the vapor deposition is performed again on the intermediate layer 138, and accordingly a second scintillator layer (grown portion in CsI:Tl vapor re-deposition) 132 constituted of CsI:Tl grows on the first scintillator layer in a state in which column diameters are uniform.

Since the first scintillator layer 131 and the second scintillator layer 132 constituting a multilayered structure via the intermediate layer 138 are formed as described above, growth of the abnormal growth portion 134 including splash generated in the first scintillator layer 131 stops in the intermediate layer 138. Moreover, the surface of the intermediate layer 138 on which the second scintillator layer starts growing by the intermediate layer 138 is a flat surface. Therefore, the abnormal growth portion 134 is inhibited from being enlarged, and generation of abnormal growth portions 136 in the second scintillator layer 132 can be reduced. Furthermore, even when the abnormal growth portions 136 are generated in the second scintillator layer 132 formed on the intermediate layer 138, the growth starts in an initial stage, and the vapor deposition of the second scintillator layer 132 ends before the portions grow to be large. Therefore, the scintillator layer can be formed while the abnormal growth portions 136 do not largely grow.

The radiation detection device of the present embodiment is completed, when the protective layer 115 is formed on the scintillator layer (CsI:Tl) constituted of the first scintillator layer 131 and the second scintillator layer 132 formed as described above to entirely prepare the scintillator panel 110, and thereafter the scintillator 110 is laminated onto the photoelectric conversion panel 100.

As a thickness of the intermediate layer 138, the thickness needs to be optimized as a thickness required for reducing the projections of the abnormal growth portions to obtain the flat surface without deteriorating sharpness which is an X-ray characteristic of the scintillator.

The thickness of the intermediate layer 138 cannot be generally determined because the size of the abnormal growth portion 134 differs with vapor deposition conditions, but is 50 μm or less, preferably 30 μm or less in order to prevent drop of the sharpness of the radiation detection device. An experimentally obtained thickness of the scintillator layer is approximately 100 to 300 μm in a case where a size of the projection by the abnormal growth portion 134 is 50 μm or less.

The material of the intermediate layer 138 needs to have good transmission with respect to a wavelength of light emitted from the scintillator layer, have heat resistance capable of withstanding temperature of about 150 to 250° C. applied in an annealing step after forming the scintillator layer, and have a flat surface even when formed into a concave/convex surface.

As a concrete material of the intermediate layer 138 having the above-described characteristics, either an organic material or an inorganic material may be used. Examples of the organic material include an olefin-based resin, particularly a poly-para-xylylene resin (e.g., manufactured by Three Bond Co., Ltd.; trade name: Parylene, hereinafter referred to as Parylene), a polyimide resin, an acryl resin, an epoxy resin and the like. As the inorganic material, silicon oxide, silicon nitride, titanium oxide or the like is usable.

As a method of forming the intermediate layer 138, the layer can be formed by vacuum film forming processes such as thermal CVD, plasma CVD, and sputtering, and liquid coating processes such as spin coating, slit coating, and dip coating.

Moreover, the flattening layer is not limited to one layer, and a stacked constitution may be formed by two or more layers.

Furthermore, the thickness of one scintillator layer in the present invention differs with the material or preparing process of the scintillator as described above, but a thickness of about 100 to 300 µm is preferable as a thickness with which the abnormal growth portions 134, 136 do not largely grow. The thickness of the whole scintillator layer 130 is preferably approximately 400 to 700 µm in such a manner that radiations are efficiently absorbed, and the drop of the sharpness is in a usable range. The thickness of the abnormal growth portion 134, 136 which could be generated at a time when the scintillator layer has a thickness of 100 µm is 20 µm or less, and therefore the intermediate layer 138 preferably has a thickness of at least 20 µm.

The protective layer 115 for protecting the scintillator layer 130 from external environments is preferably formed on the scintillator layer 130 in such a manner that the scintillator layer 130 is coated. The material and the preparing process which have heretofore been known can be used in the protective layer 115.

A method of making the radiation detection device in the present embodiment will be described hereinafter.

The photoelectric conversion element portion 102 constituted of the photo sensor and the TFT formed of a-Si was formed on a nonalkali glass substrate which was the glass substrate 101 having a thickness of 1.0 mm, and a size of 500 mm square, and the protective layer 104 constituted of SiNx was formed on the portion to prepare the photoelectric conversion panel 110.

Next, an aluminum thin film was formed in 1500 Å as a reflective layer on the substrate 111 formed of amorphous carbon having a thickness of 0.7 mm and a size of 450 mm square by a sputtering method.

Next, the substrate 111 was disposed on the substrate holder of the vapor deposition device, cesium iodine (hereinafter referred to as CsI), and thallium iodine (hereinafter referred to as TlI) were vapor-deposited to achieve a thickness of 200 µm by a vapor deposition process, and the first scintillator layer 131 (CsI:Tl) having the columnar crystal structure was formed. The abnormal growth portion 134 having a maximum diameter of 300 µm was generated on the surface of the formed first scintillator layer 131.

Next, Parylene was formed into a thickness of 15 µm on the first scintillator layer 131 by a thermal CVD process. Furthermore, a polyimide resin molten in a solvent was applied on Parylene by a slit coating process, dried, hardened, and formed into a thickness of 20 µm to form the intermediate layer 138 having a double-layer constitution of Parylene and polyimide.

Next, the second scintillator layer 132 was formed on the intermediate layer 138 by a material and a method similar to those of the first scintillator layer 131, and the scintillator layer 130 having a total thickness of about 500 µm was formed. After the layer was formed, the abnormal growth portion 136 having a diameter of 350 µm at maximum, and a height of 50 µm was generated on the surface of the second scintillator layer 132, but the portion was generated in a position different from that of the first scintillator layer 131, and continuity was not found.

The projections by the abnormal growth portions 136 were restored by the crushing which was the method of the known example, and the abnormal growth portions 136 were removed to such an extent that any projection was not recognized on the plane.

Next, the protective layer 115 was formed by Parylene by the thermal CVD process in such a manner that the surface and side surfaces of the scintillator layer 130 were coated, and the scintillator panel 110 was obtained.

Finally, the photoelectric conversion panel 100 and the scintillator panel 110 were thermally laminated onto each other by a roll laminator using the adhesive layer 140 constituted of an acrylic adhesive to prepare the radiation detection device.

Sixth Embodiment

In Embodiments 4, 5 described above, the example in which the scintillator layer 130 comprises two scintillator layers: the first scintillator layer 131; and the second scintillator layer 132, and the intermediate layer 138 disposed between the layers has been described, but the present invention is not limited to this, and there may be a mode in which three or more scintillator layers are disposed, and a plurality of intermediate layers are formed among the scintillator layers. In the present embodiment, a radiation detection device will be described in which three scintillator layers are disposed, and intermediate layers are formed among the scintillator layers.

Figure 9:
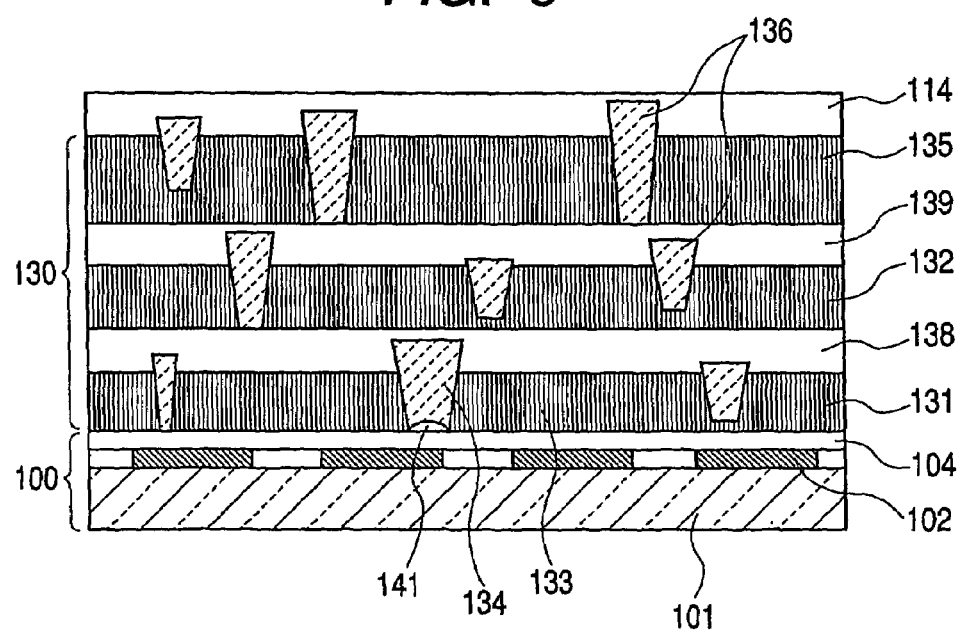
FIG. 9 is a cross-sectional view of the radiation detection device according to Embodiment 6 of the present invention.

FIG. 9 shows a cross-sectional view of the radiation detection device in Embodiment 6.

In Embodiment 6, the present invention is carried out as a radiation detection device in a case where CsI:Tl (scintillator layer) is vapor-deposited directly on a sensor panel (photoelectric conversion panel) (referred to also as "direct vapor deposition type").

The radiation detection device shown in FIG. 9 has: a photoelectric conversion panel 100; a scintillator layer 130 constituted of CsI:Tl formed by direct vapor deposition on the photoelectric conversion panel 100; a protective layer 114 formed on the scintillator material 130; a reflective layer (not shown) constituted of an aluminum thin film; and a protective layer (not shown).

The photoelectric conversion panel 100 shown in FIG. 9 comprises: a glass substrate 101; a photoelectric conversion element portion 102 constituted of a photo sensor and a thin-film transistor (TFT) using amorphous silicon (a-Si); and a protective layer 104 formed of silicon nitride and the like to protect the photoelectric conversion element portion 102. In the photoelectric conversion element portion 102, the photo sensor and the TFT formed in the same layer, or a mutually stacked structure of them may be applied.

X-rays which have fallen downwards from above in FIG. 9 pass through the protective layer (not shown), reflective layer (not shown), and protective layer 114, and are absorbed by the scintillator layer 130, and thereafter the scintillator layer 130 emits visible light. Since the visible light travels through columnar crystals of the scintillator layer 130 on the photoelectric conversion panel 100 side, the light enters the photoelectric conversion element portion 102 through the protective layer 104 without diffusing. In the photoelectric conversion element portion 102, the incident visible light is converted into an electric signal, and read to the outside through a wiring portion (not shown) by switching. In this manner, incident X-ray information is converted into a two-dimensional digital image by the X-ray detection device shown in FIG. 9.

In the above-described constitution, the scintillator layer 130 has a first scintillator layer (CsI:Tl initial grown portion) 131 constituted of CsI:Tl crystallized/grown into columnar shapes by first vapor deposition. The first scintillator layer 131 includes an abnormal growth portion 134 in addition to a normally crystallized/grown normal portion 133. The abnormal growth portion 134 is abnormally grown by foreign matters 141 attached to the substrate 101 of the photoelectric conversion panel 100, and projections (not shown) which are concave/convex portions are formed on the surface in an initial stage. The surface irregularities are reduced by the intermediate layer 138 disposed on the first scintillator layer, and the projections are flattened. The surface of the abnormal growth portion 134 is flattened by the intermediate layer 138 in this manner, vapor deposition is performed again on the first intermediate layer 138, and accordingly a second scintillator layer (grown portion in CsI:Tl vapor re-deposition) 132 constituted of CsI:Tl grows on the intermediate layer in a state in which column diameters are uniform. The second scintillator layer 132 sometimes includes abnormal growth portions 136, in addition to the normally crystallized/grown normal portion 133. This abnormal growth portion 136 causes the projection on the surface of the second scintillator layer 132. The surface irregularities are reduced by a second intermediate layer 139 disposed on the second scintillator layer, and the projections are flattened. The surface of the abnormal growth portion 136 is flattened by the second intermediate layer 139 in this manner, the vapor deposition is performed again on the second intermediate layer 139, and accordingly a third scintillator layer (grown portion in CsI:Tl vapor re-deposition) 135 constituted of CsI:Tl grows on the intermediate layer in a state in which column diameters are uniform.

As described above, since the first scintillator layer 131, the second scintillator layer 132, and the third scintillator layer constituting a multilayered structure via the first intermediate layer 138 and the second intermediate layer 139 are formed as described above, growth of the abnormal growth portion 134 including splash generated in the first scintillator layer 131 stops in the intermediate layer 138. Moreover, the surface of the second intermediate layer 138 on which the second scintillator layer starts growing by the first intermediate layer 138 is a flat surface. Therefore, the abnormal growth portion 136 is inhibited from being enlarged, and generation of abnormal growth portions 136 in the second scintillator layer 132 can be reduced. Furthermore, even when the abnormal growth portions 136 are generated in the second scintillator layer 132 formed on the intermediate layer 138, the growth starts in an initial stage, and the vapor deposition of the second scintillator layer 132 ends before the portions grow to be large. Therefore, the scintillator layer can be formed while the abnormal growth portions 136 do not largely grow. The above-described effect also applies to the second intermediate layer 139 and the third scintillator layer.

A method of making the radiation detection device in the present embodiment will be described hereinafter.

The photoelectric conversion element portion 102 constituted of the photo sensor and the TFT formed of a-Si was formed on a nonalkali glass substrate which was the glass substrate 101 having a thickness of 1.0 mm, and a size of 500 mm square, and the protective layer 104 constituted of SiNx was formed on the portion to prepare the photoelectric conversion panel 110.

Next, cesium iodine (hereinafter referred to as CsI), and thallium iodine (hereinafter referred to as TlI) were vapor-deposited to achieve a thickness of 175 μm on the photoelectric conversion panel 110 by a vapor deposition process, and the first scintillator layer 131 (CsI:Tl) having the columnar crystal structure was formed. The abnormal growth portion 134 having a maximum diameter of 230 μm, and a height of 27 μm was generated on the surface of the formed first scintillator layer 131.

Next, Parylene was formed into a thickness of 15 μm on the first scintillator layer 131 by a thermal CVD process. Furthermore, a polyimide resin molten in a solvent was applied on Parylene by a slit coating process, dried, hardened, and formed into a thickness of 15 μm to form the first intermediate layer 138 having a double-layer constitution of Parylene and polyimide.

Next, the second scintillator layer 132 was formed on the first intermediate layer 138 by a material and a method similar to those of the first scintillator layer 131, and the scintillator layer 130 having a total thickness of about 175 μm was formed. After the layer was formed, the abnormal growth portion 136 having a diameter of 230 μm at maximum, and a height of 27 μm was generated on the surface of the second scintillator layer 132, but the portion was generated in a position different from that of the first scintillator layer 131, and continuity was not found.

Next, Parylene was formed into a thickness of 15 μm on the second scintillator layer 132 by the thermal CVD process. Furthermore, a polyimide resin molten in the solvent was applied on Parylene by the slit coating process, dried, hardened, and formed into a thickness of 15 μm to form the second intermediate layer 139 having a double-layer constitution of Parylene and polyimide.

Next, the third scintillator layer 135 was formed on the second intermediate layer 139 by a material and a method similar to those of the first scintillator layer 131, and the scintillator layer 130 having a total thickness of about 175 μm was formed. After the layer was formed, the abnormal growth portion 136 having a diameter of 230 μm at maximum, and a height of 27 μm was generated on the surface of the second scintillator layer 132, but the portion was generated in a position different from that of the second scintillator layer 132, and continuity was not found.

The projections by the abnormal growth portions 136 were restored by the crushing which was the method of the known example, and the abnormal growth portions 136 were removed to such an extent that any projection was not recognized on the plane.

Finally, the protective layer 114 was formed by Parylene obtained by the thermal CVD process in such a manner that the surface and side surfaces of the scintillator layer 130 were coated, and the radiation detection device shown in FIG. 8 was obtained.

In the present invention, a surface modification treatment such as an atmospheric pressure plasma treatment may be performed on the surface of the protective layer or the intermediate layer onto which the scintillator layer is vapor-deposited, and an adhesion force to the scintillator layer may be obtained. As means of surface modification, methods such as UV process, ozone process, and low-pressure plasma process may be used in addition to an atmospheric plasma process.

Seventh Embodiment

Figure 10:
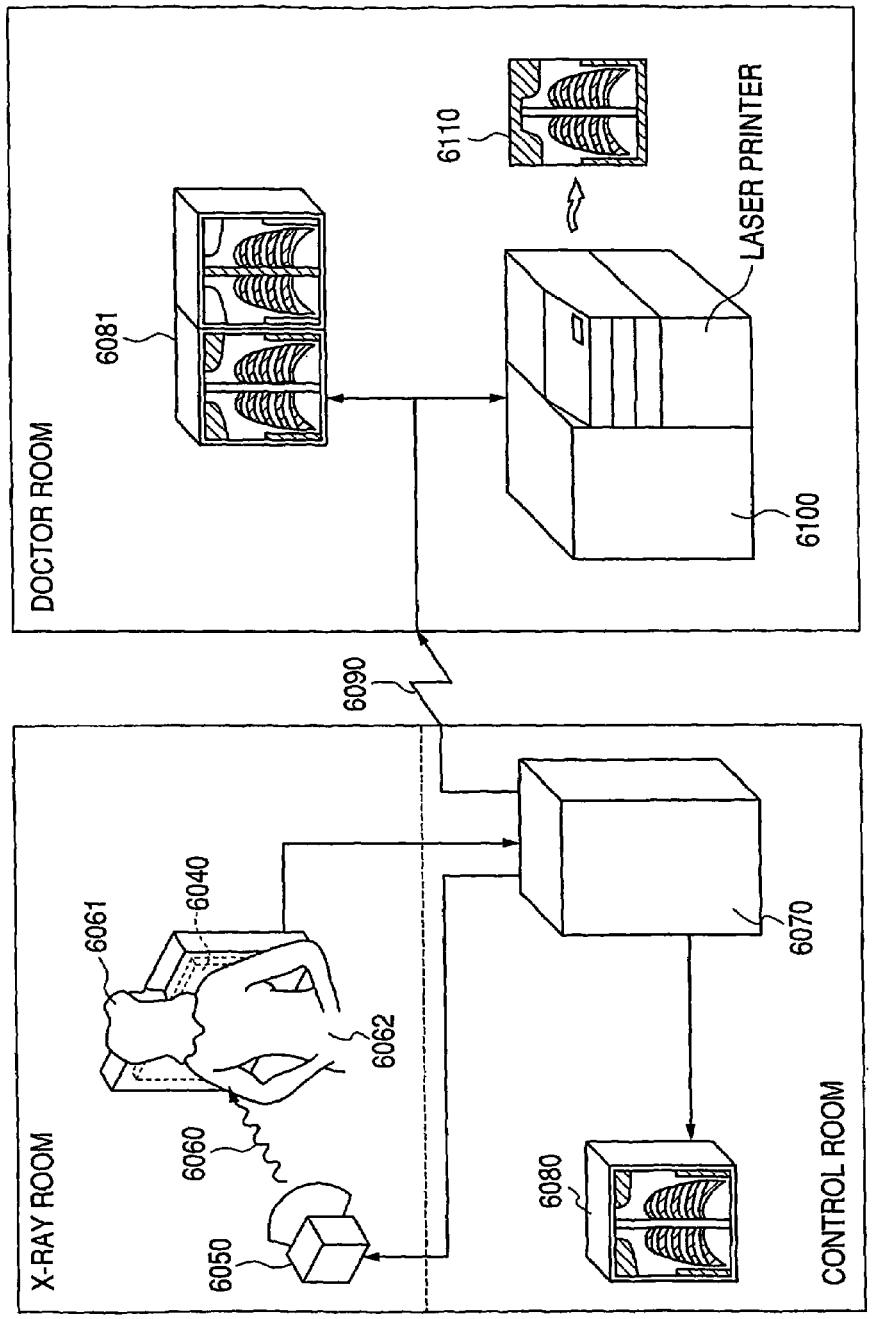
FIG. 10 is a schematic diagram showing an example in which the radiation detection device of the present invention is applied as a radiation detection system.

FIG. 10 shows an application example of a radiation detection device according to the present invention with respect to an X-ray diagnosis system (radiation image pick-up device).

In FIG. 10, X-rays 6060 produced by an X-ray tube 6050 enters a radiation detection device (image sensor) 6040 shown in FIG. 3 through a chest 6062 of a patient or a subject 6061. The incident X-rays include information on the inside of the patient 6061. A scintillator layer of the radiation detection device 6040 emits light in response to incidence of the X-ray, the light is photoelectrically converted by a photoelectric conversion element portion of the radiation detection device 6040, and electric information is obtained. This information is converted into digital information, and processed as an image by an image processor 6070 which is signal processing means, so that the image can be observed by a display 6080 which is display means of a control room.

Moreover, the information can be transferred to a remote area by transmission means such as a telephone circuit 6090 and the like, and displayed on a display 6081 which is display means in another place like a doctor room or stored in recording means such as an optical disk and the like, so that diagnosis by a doctor in the remote area is possible. The information may be recorded in a film 6110 by a film processor 6100 which is recording means.

As described above, the present invention can be applied to a medical X-ray sensor, and may be effectively applied to another application such as non-destructive inspection.

As described above, the present invention is applicable to radiation image pick-up systems such as a medical X-ray diagnosis device, non-destructive inspection device and the like, a radiation detection device for use in the system, a method of making the device, a scintillator device, and a method of making the device.

This application claims priority from Japanese Patent Application No. 2003-362084 filed Oct. 22, 2003, and Japanese Patent Application No. 2003-362085 filed Oct. 22, 2003, which are hereby incorporated by reference herein.

The invention claimed is:

1. A method of making a radiation detection device, composing:
    a first deposition step of depositing a first scintillator layer having a columnar crystal structure on a sensor panel having a photoelectric conversion unit comprising a plurality of photoelectric conversion elements arranged one-dimensionally or two-dimensionally on a substrate; and
    a second deposition step of depositing a second scintillator layer having a columnar crystal structure on the first scintillator layer.

2. The making method according to claim 1, further comprising: a flattening step of flattening a projection existing on the surface of the first scintillator layer after the first deposition step,
    wherein the second deposition step comprises the steps of: depositing the second scintillator layer on the flattened surface of the first scintillator layer.

3. The making method according to claim 2, wherein the flattening step comprises the steps of: crushing the projection or melting the projection.

4. The making method according to claim 1, further comprising: a step of forming a light-transmitting intermediate layer on the first scintillator layer after the first deposition step,
    wherein the second deposition step comprises the steps of: depositing the second scintillator layer on the intermediate layer formed on the first scintillator layer.

5. A method of making a scintillator panel, comprising:
    a first deposition step of depositing a first scintillator layer having a columnar crystal structure on a support member; and
    a second deposition step of depositing a second scintillator layer having a columnar crystal structure on the first scintillator layer.

6. The making method according to claim 5, further comprising: a flattening step of flattening a projection existing on the surface of the first scintillator layer after the first deposition step,
    wherein the second deposition step comprises the steps of: depositing the second scintillator layer on the flattened surface of the first scintillator layer.

7. The making method according to claim 5, further comprising: a step of forming a light-transmitting intermediate layer on the first scintillator layer after the first deposition step,
    wherein the second deposition step comprises the step of: depositing the second scintillator layer on the intermediate layer formed on the first scintillator layer.

* * * * *